United States Patent
Xie et al.

(10) Patent No.: US 11,205,592 B2
(45) Date of Patent: Dec. 21, 2021

(54) SELF-ALIGNED TOP VIA STRUCTURE

(71) Applicant: International Business Machines Corporation, Armonk, NY (US)

(72) Inventors: Ruilong Xie, Niskayuna, NY (US); Cheng Chi, Jersey City, NJ (US); Chih-Chao Yang, Glenmont, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 122 days.

(21) Appl. No.: 16/744,456

(22) Filed: Jan. 16, 2020

(65) Prior Publication Data
US 2021/0225705 A1    Jul. 22, 2021

(51) Int. Cl.
| H01L 21/02 | (2006.01) |
| H01L 21/768 | (2006.01) |
| H01L 21/285 | (2006.01) |
| H01L 23/532 | (2006.01) |

(52) U.S. Cl.
CPC .... H01L 21/76897 (2013.01); H01L 21/0228 (2013.01); H01L 21/28562 (2013.01); H01L 21/76816 (2013.01); H01L 21/76849 (2013.01); H01L 21/76877 (2013.01); H01L 23/53209 (2013.01)

(58) Field of Classification Search
None
See application file for complete search history.

(56) References Cited

U.S. PATENT DOCUMENTS

| 5,368,711 | A | 11/1994 | Poris |
| 5,693,568 | A | 12/1997 | Liu et al. |
| 7,205,228 | B2 | 4/2007 | Padhi et al. |
| 7,655,564 | B2 | 2/2010 | Shinriki et al. |
| 9,613,861 | B2 | 4/2017 | Anderson et al. |
| 10,020,223 | B1 | 7/2018 | Anderson et al. |
| 10,020,224 | B2 | 7/2018 | Anderson et al. |
| 10,262,944 | B2 * | 4/2019 | Lin .................. H01L 21/76879 |
| 2008/0124484 | A1 | 5/2008 | Shinriki et al. |
| 2014/0231998 | A1 * | 8/2014 | Kuo .................. H01L 21/76834 257/751 |
| 2015/0056800 | A1 | 2/2015 | Mebarki et al. |
| 2018/0061707 | A1 | 3/2018 | Clevenger et al. |

* cited by examiner

*Primary Examiner* — Bradley Smith
(74) *Attorney, Agent, or Firm* — Cantor Colburn LLP; L. Jeffrey Kelly (57) ABSTRACT

A back end of line interconnect structure and methods for forming the interconnect structure including a self-aligned via generally includes a subtractive etch process to define the vias. The vias include a via core and a liner to provide a critical dimension equal to a critical dimension of an underlying metal line. The metal lines are free of the liner. The method provides some via metal liner material on top of metal lines that do not includes a via in direct contact therewith.

20 Claims, 5 Drawing Sheets

SELF-ALIGNED TOP VIA STRUCTURE

BACKGROUND

The present invention is generally directed to semiconductor devices and methods of manufacturing the same, and more particularly, to methods and structures for forming a self-aligned top via structure.

Semiconductor structures are typically fabricated using multiple layers, which can include two or more patterned conductive layers separated by intervening insulation layers. Considering the layers to be horizontally stacked, vertical points of contact between the two or more conductive layers through the insulation layers are known as via structures, which provide a wiring pattern for the integrated circuit.

SUMMARY

Embodiments of the present invention are directed to structures and methods of fabricating a semiconductor device including a back end of line interconnect structure. In one or more embodiments of the invention, a back end of line interconnect structure includes a plurality of metal filled vias, each via including a via core of a first metal and a liner of a second metal. A plurality of metal lines formed of a third metal underly the metal filled vias. The metal filled vias are aligned with selected ones of the plurality of metal lines. The structure further includes a dielectric material, wherein the plurality of metal filled vias and the plurality of metal lines are defined in the dielectric material.

In one or more embodiments of the invention, a method for forming an interconnect structure includes depositing a dielectric layer onto a metal layer including a first metal. Via openings are formed in the dielectric layer and metallized with a second metal to form a via metallization level. A hard mask layer is deposited and patterned to form a metal line pattern therein. The metal line pattern is transferred to the via metallization level to define metal vias. Via metal residues are removed by isotropically etching and decrease a dimension of the metal vias to form a via core. A third metal is selectively deposited onto the via core to restore a critical dimension of the metal via to be equal to a linewidth of the metal line pattern in the hardmask layer. The metal line pattern in the hardmask layer is transferred into the metal layer to form metal lines of the first metal, wherein the critical dimension of each of the metal vias is equal to a critical dimension of the metal lines. The hardmask is removed and a dielectric material deposited to form the interconnect.

In one or more embodiments of the invention, a method of forming an interconnect structure includes depositing a bulk metal layer of a first metal onto a surface. A dielectric layer is deposited on the bulk metal layer. Metal filled vias are formed in the dielectric layer with a second metal. A hardmask layer is deposited on the metal filled vias in the dielectric layer and patterning the hardmask layer to form a metal line pattern. The metal line pattern is transferred to the metal filled vias. The metal filled vias are trimmed to remove residual via metal to form a metal via core. A third metal is selectively grown onto exposed surfaces of the first and second metals. The metal line pattern is transferred to the bulk metal layer, wherein the critical dimension of the metal vias defined by the metal via core and the third metal thereon are equal to a critical dimension of the metal lines.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. All of these variations are considered a part of the specification.

In the accompanying figures and following detailed description of the embodiments of the invention, the various elements illustrated in the figures are provided with two or three digit reference numbers.

DETAILED DESCRIPTION

The formation of high-quality interconnects, which are typically formed during back end of line processing, is a critical part of ultra-large scale integration (ULSI) integrated circuits. The back end of line (BEOL) is the portion of integrated circuit fabrication where the earlier formed individual devices (transistors, resistors, capacitors and the like) are interconnected with wiring on the wafer, i.e., the metallization layers or levels. In conventional fabrication processes, vias and upper wiring structures are formed in a dual damascene process. In this type of process, via openings and trenches are formed in a dielectric layer prior to the deposition of metal materials. In the dual damascene processes, the via openings typically have a tapered edge with a smaller cross-sectional area (width) at the bottom of the opening than at a top of the opening. Due to this dimensional configuration, via resistance and manufacturability has been degrading at advanced nodes. For example, due to scaling, via resistance has been increasing by greater than 2× the rate of wires (i.e., lines). Also, etching and filling of the via openings are becoming increasingly difficult in these advanced nodes. For example, it is becoming ever more difficult to place liners within the via openings without completely filling the via openings with highly resistive material. Also, it becomes very difficult to align the via openings with an underlying metal wiring layer.

The present invention is generally directed to methods and structures of forming a self-aligned top via structure. The methods and structures of forming a self-aligned top via structure generally include a subtractive etching process for metal patterning to provide the self-aligned top via structure, which further includes via residue removal that can occur as a function of misalignment. As will be described in greater detail below, the via residue can be removed using, for example, an atomic layer etch process. Once removed, a selective metal growth process over the exposed metal surfaces can be used to recover the desired critical dimension of the via structure.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modem microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such as copper to chlorine and hydrogen plasmas at low temperature (below 20-C). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

Figure 1:
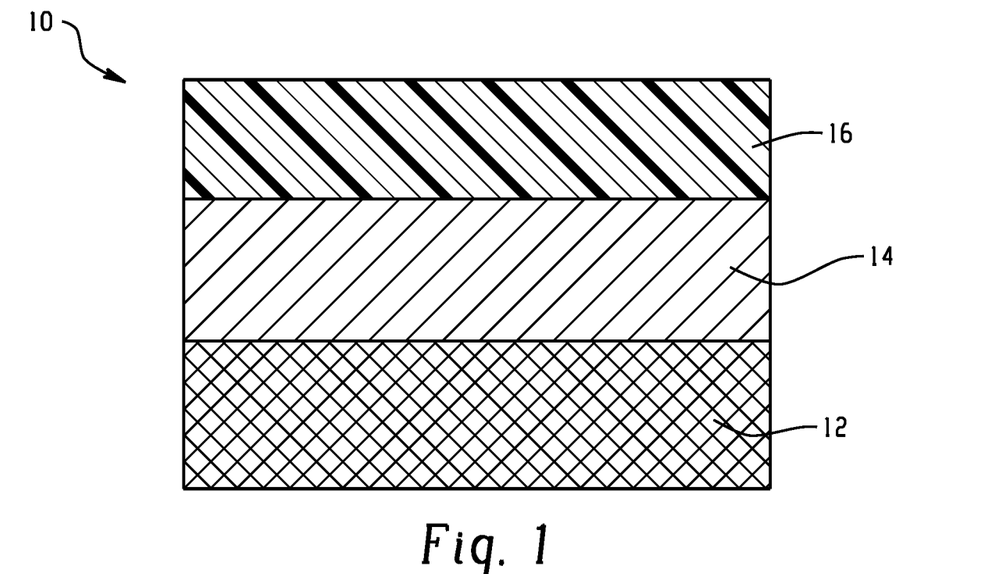
FIG. 1 is a cross-sectional view of a partial interconnect structure including a dielectric layer deposited on a metal layer according to embodiments of the invention.

Turning now to a more detailed description of aspects of the present invention, FIG. 1 depicts a cross-sectional view a semiconductor structure 10 including an underlying device layer 12, a metal layer 14 on the underlying device layer 12, and a dielectric layer 16 on the metal layer 14. Reference to the cross-sectional view in this Figure and the following Figures refers to the cut line shown in the top down view of FIG. 9. The resulting structures include metal lines defined by trenches and vias defined by openings, which are also referred to in the art as contact holes. The via shape is not intended to be limited can be circular, square or rectangular shaped.

The underlying device layer 12 is not intended to be limited and can include, for example, transistors, capacitors, resistors, and the like.

The metal layer 14 can include aluminum, copper, ruthenium, cobalt, rhodium, iridium, nickel, or alloys thereof or the like as desired for the application and can be deposited by CVD, sputtering, electrochemical deposition or like processes.

The dielectric layer 16 can be any dielectric material although low-k dielectric materials are preferred. Suitable dielectric materials include carbon-doped silicon dioxide materials; fluorinated silicate glass (FSG); organic polymeric thermoset materials, silicon oxycarbide; SiCOH dielectrics; SiNCH dielectrics, fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell). JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). Other suitable dielectric materials include organic polymeric thermoset materials, consisting essentially of carbon, oxygen and hydrogen, including the low-k polyarylene ether polymeric material known as SiLK™ (available from The Dow Chemical Company), and the low-k polymeric material known as FLARE™ (available from Honeywell).

Figure 2:
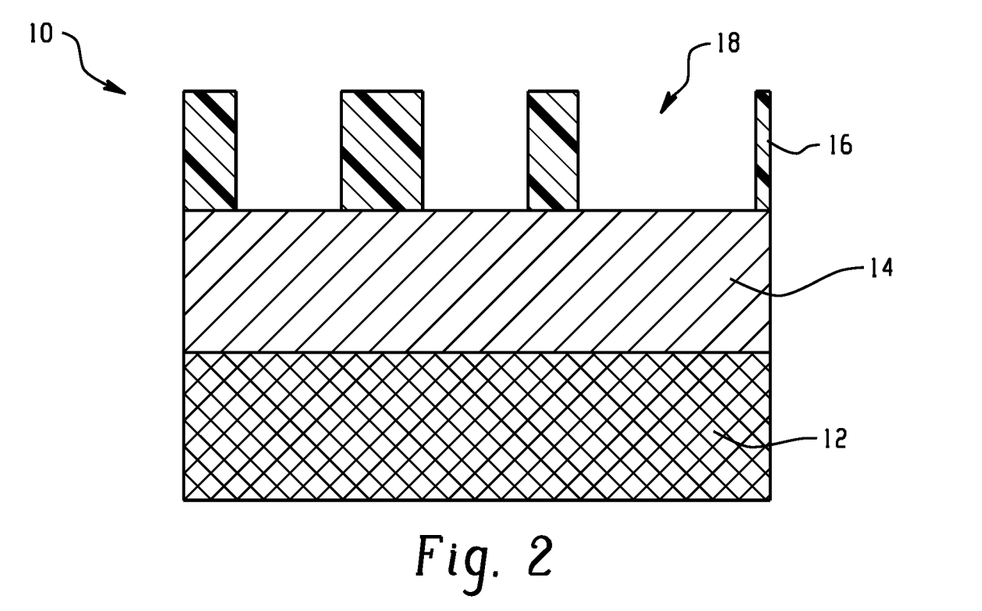
FIG. 2 depicts a cross-sectional view of FIG. 1 subsequent to patterning and etching of the dielectric layer to form via openings according to embodiments of the invention.

FIG. 2 depicts a cross-sectional view of the structure of FIG. 1 subsequent to lithographic patterning and etching for forming via openings 18. The lithographic step typically includes applying a photoresist to the surface of the dielectric layer 16, exposing the photoresist to a desired pattern of radiation, and developing the exposed resist utilizing a conventional resist developer to form a pattern. The etching process can be a dry etching or wet etching process. The term "wet etching" generally refers to application of a chemical solution. The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the via openings 18, which can also be referred to as contact holes in the art. The dimension of the via openings 18 are greater than an intended critical dimension of the metal filled vias in the final interconnect structure.

Figure 3:
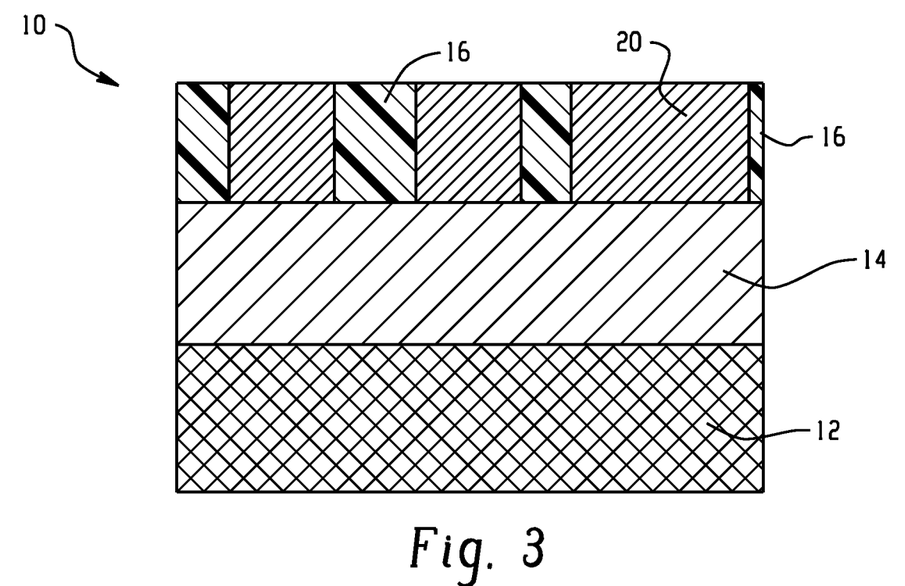
FIG. 3 depicts a cross-sectional view of FIG. 2 subsequent to metallization of the via openings and planarization according to embodiments of the invention.

FIG. 3 depicts a cross-sectional view of the structure of FIG. 2 subsequent to deposition of a metal 20 into the via openings 18 and formation of an overburden thereon (not shown). Metal 20 can be the same or different metal as the metal used in the metal layer 14. Suitable metals include, without limitation, aluminum, copper, ruthenium, cobalt, rhodium, iridium, nickel, or alloys thereof or the like as desired for the application. Deposition of the metal 20 into the vias 18 can be provided by CVD, sputtering, electrochemical deposition or like processes. Following deposition, the layer is subjected to a planarization process to remove the overburden and form a planar surface.

For example, the overburden can be removed and the surface planarized using an electropolishing process. In an electropolishing process, small amounts of metal are etched by electroetch or electrochemical etching to provide a metal interconnect having a top conductor surface generally coplanar to the top surface of the dielectric. In another embodiment, the planar surface is formed by chemical mechanical polishing (CMP). The process generally includes an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation. This removes excess material and tends to even out any irregular topography, making the wafer flat or planar. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 4:
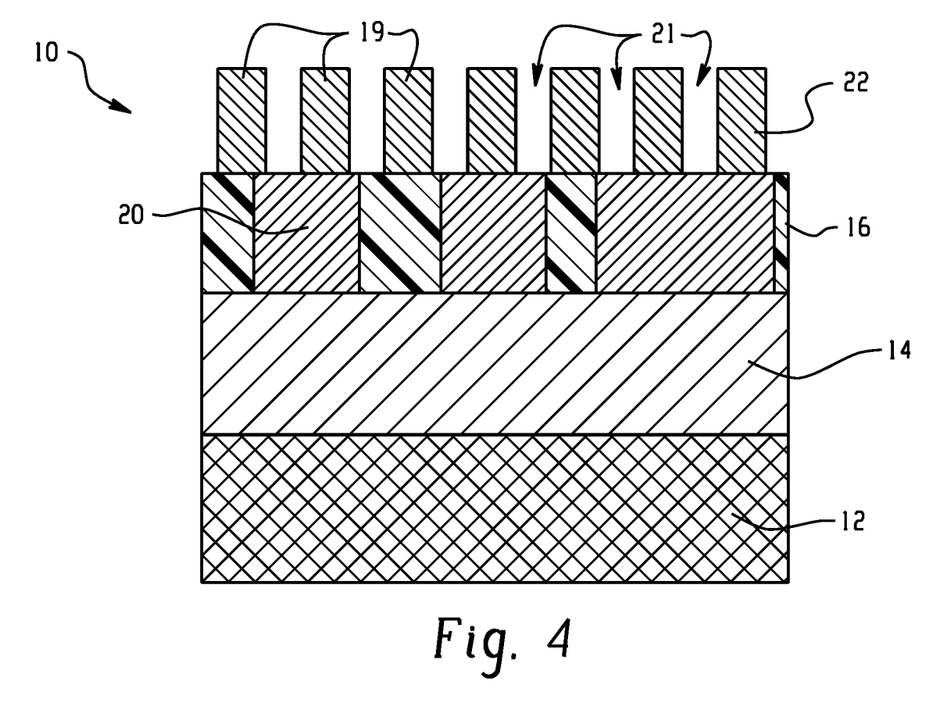
FIG. 4 depicts a cross-sectional view of FIG. 3 subsequent to deposition of a hardmask layer and patterning metal lines in the hardmask layer according to embodiments of the invention.

FIG. 4 depicts a cross-sectional view of the structure of FIG. 3 subsequent to deposition and metal line patterning in a hardmask layer 22. The hardmask layer 22 is formed using known deposition techniques. The hard mask layer 22 can be formed of a material that has etch selectivity with respect to the underlying materials. i.e., the metals 14, 20, and dielectric layer 16. For example, the hardmask layer 22 can be formed of a nitride material such as TiN or SiN, etc. Alternatively, the hardmask layer 22 can include a multi-layer hard mask structure including, for example, a silicon nitride (SiN) layer and a titanium oxide (TiOx) or titanium nitride (TiN) layer. The hardmask layer, once deposited, can be lithographically patterned and etched in a similar manner to that described above to form a metal line pattern.

As will be described and shown in the additional processing steps in greater detail below, the metal line pattern formed in the hardmask layer 22 is used to etch the metal 20 in the via openings 18 and dielectric 16 (see preceding FIG. 3) from which metal vias are defined. The metal line pattern includes an array of lines 19 and spaces 21 generally at a pitch of about 1:1 such that the spaces are transferred during a directional etch process into the underlying layer containing the metal 20 within the via openings 18 that had been formed in dielectric 16. Consequently, the directional etch of the metal line pattern in the hardmask layer 22 provides a mismatch such that in some instances the spaces from the metal line pattern is aligned with the underlying dielectric 16 only, a portion of the dielectric 16 and the metal in the via opening 18, and a portion of the metal 20 only within the via opening 18. The spaces 21 in the metal line pattern have a width dimension that is much smaller than a diameter dimension of the via opening 18, wherein these dimensions and position of the via openings dictate the number and diameters of the metal vias to be formed from the metal 20 in the via openings 18

Figure 5:
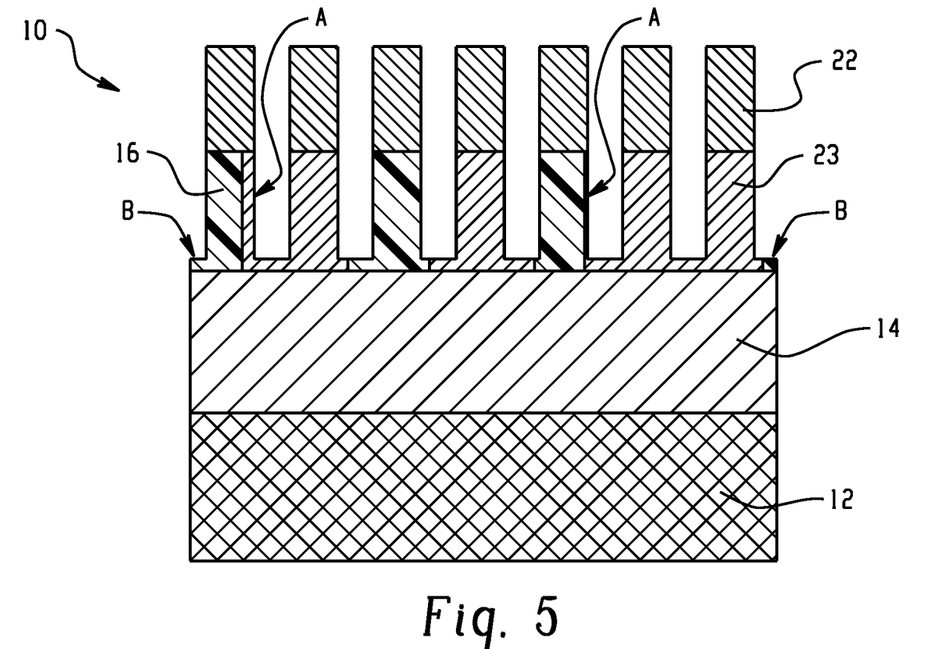
FIG. 5 depicts a cross-sectional view of FIG. 4 subsequent to anisotropic etch of the metal line pattern in the hardmask layer into the via metallization layer according to embodiments of the invention.

FIG. 5 depicts a cross-sectional view of the structure of FIG. 4 subsequent to anisotropic etch of the hardmask layer 22 to transfer the metal line pattern to the layer containing the metal 20 and dielectric 16, i.e. the via metallization level, so as to form metal vias 23. As used herein, an "anisotropic etch process" denotes a directional etch process in which the etch rate in the direction normal to the surface to be etched is greater than in the direction parallel to the surface to be etched. An exemplary anisotropic etch includes reactive-ion etching (RIE). Other examples of anisotropic etching that can be used include ion beam etching, plasma etching or laser ablation. The anisotropic etch results in a subtractive etch of the metal layer 20 to generally define metal vias in the via metallization level. As shown, any via misalignment can result in metal residue on a portion of the dielectric sidewall as indicated at "A". Additionally, via misalignment can result in a portion of the dielectric 16 remaining on top of the metal layer 14 as indicated at "B".

The etching apparatus used in carrying out the anisotropic etch can include any commercially available reactive ion etching (RIE) apparatus, or magnetically enhanced reactive ion etching (MERIE) apparatus, capable of supporting a wafer of the size desired to be etched in which gases can be introduced at the desired flow rates and a plasma maintained at the power levels used for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; the Quad reactive ion etcher by Drytek, and reactive ion exchange tools available from Tokyo Electron Limited.

Figure 6:
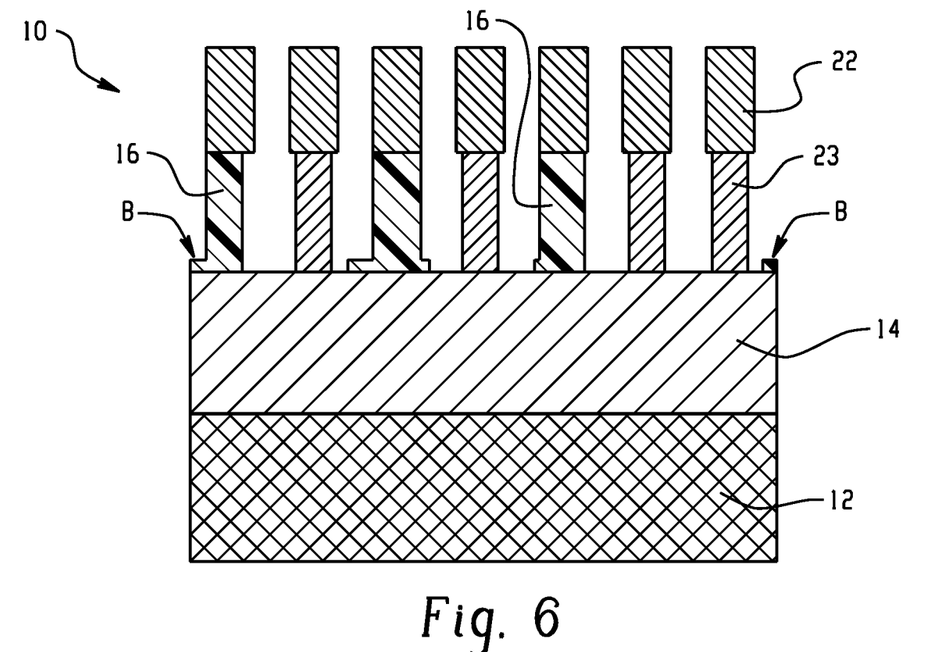
FIG. 6 depicts a cross-sectional view of FIG. 5 subsequent to isotropic etch to remove the via metal residues according to embodiments of the invention.

FIG. 6 depicts a cross-sectional view of the structure of FIG. 5 subsequent to an isotropic etch process to remove the via residual metal on the dielectric sidewalls and the exposed bottom surface as previously indicated at "A" in FIG. 5. The isotropic etch further removes some of the metal defining the metal vias 23, where the remaining metal vias 23 define a via core having a critical dimension less than an intended critical dimension (CD) in the final interconnect structure. That is, the via core has a diameter that is less than a width of the metal line pattern in the hardmask layer. An exemplary isotropic etch process includes but is not limited to atomic layer etching, which can remove a relatively small amount material on the order of a few angstroms to a few nanometers. The isotropic etch process is selected to be selective to remove the metal 20 from the dielectric sidewalls 16 and not the dielectric 16 itself or the hardmask material 22. As such, the dielectric 16 as previously indicated at "B" on the metal layer 14 remains.

Figure 7:
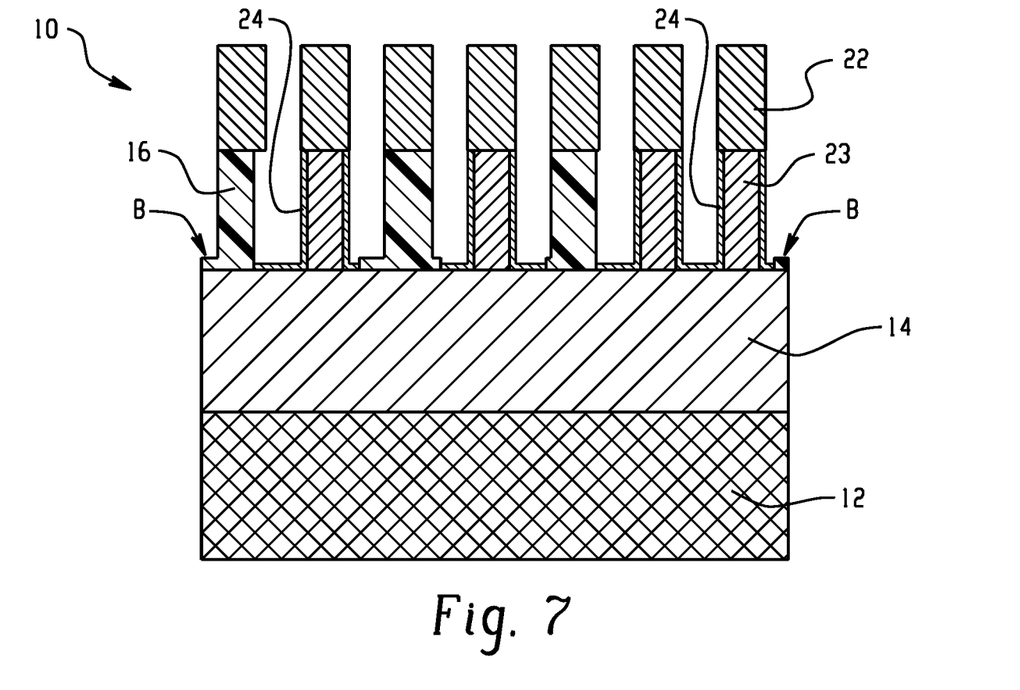
FIG. 7 depicts a cross-sectional view of FIG. 6 subsequent to selective metal growth on the exposed metal surfaces to recover a critical dimension of the vias according to embodiments of the invention.

FIG. 7 depicts a cross-sectional view of the structure of FIG. 6 subsequent to selective metal growth of metal 24 on exposed surfaces of the metal via 23 at a thickness that recovers the original CD. That is, the via CD defined by the via core and the liner, collectively indicated at reference numeral 27, as deposited by the selective metal grown is equal to the linewidth of the metal line pattern formed in the hardmask as shown. Metal 24 can be the same as or different from metal 20.

Figure 8:
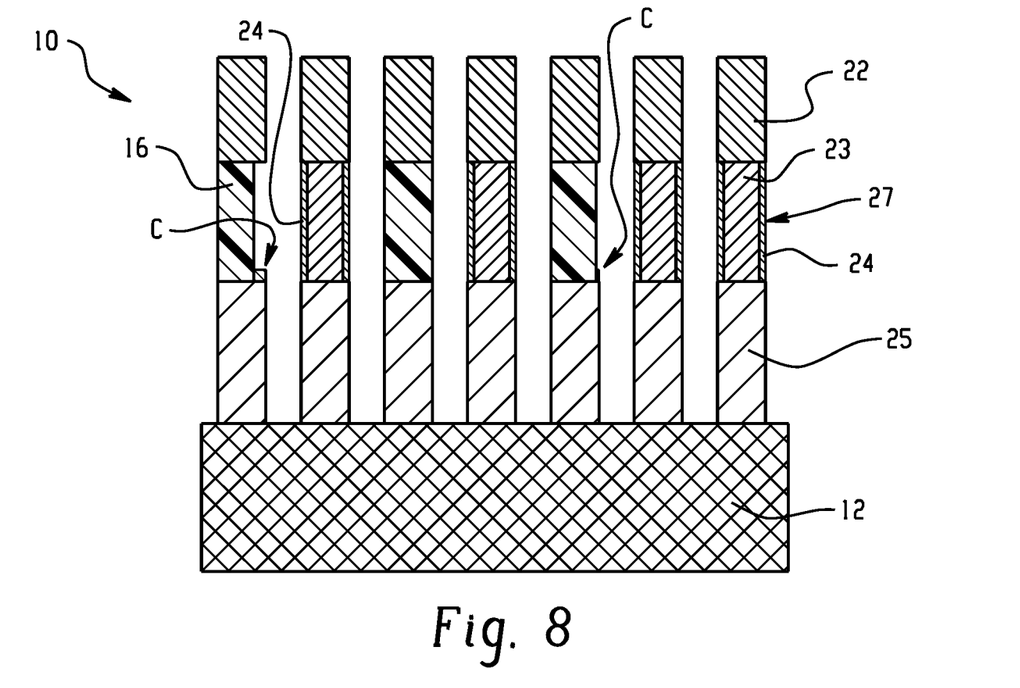
FIG. 8 depicts a cross-sectional view of FIG. 7 subsequent to anisotropic etch to define metal lines underlying the via level according to embodiments of the invention.

FIG. 8 depicts a cross-sectional view of the structure of FIG. 7 subsequent to anisotropic etch to transfer the metal line pattern in the hardmask layer to the metal layer 14 so as to form trenches therein and subtractively define a plurality of metal lines 25 in the metal layer 14. As a result, some of the metal lines 25 free of vias in contact therewith include liner metal 24 on a top surface thereof as indicated at "C" on top of some of the metal lines, which are unique to the interconnect structure.

Figure 9:
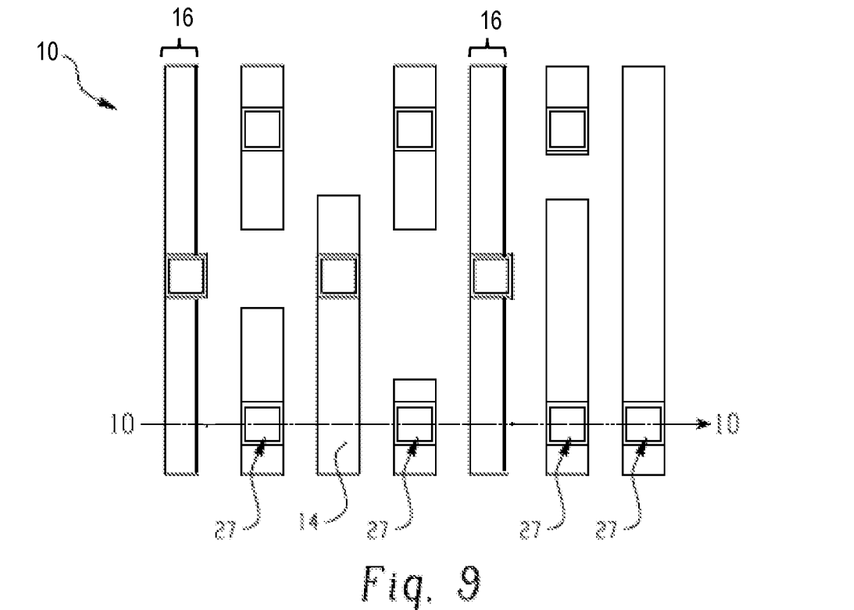
FIG. 9 depicts a top down view of the resulting interconnect structure subsequent to hardmask removal and dielectric fill according to embodiments of the invention.
Figure 10:
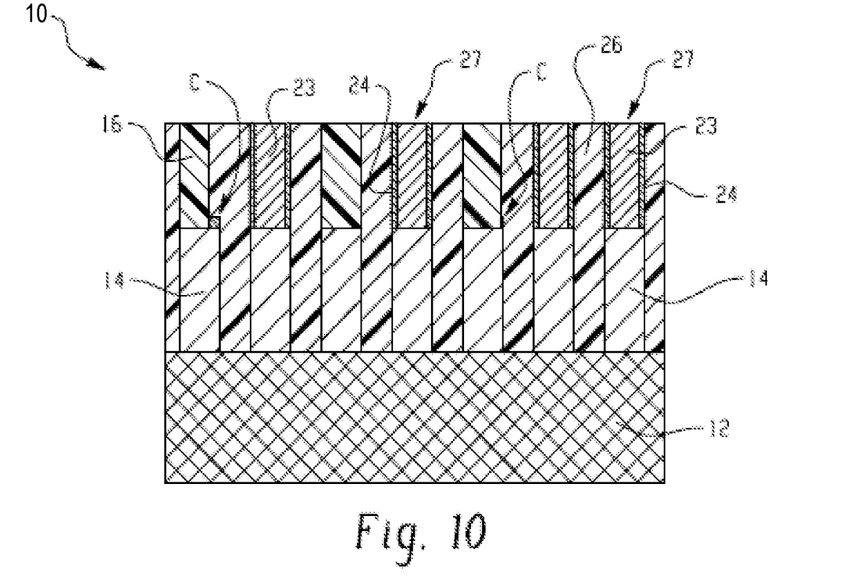
FIG. 10 depicts a cross-sectional view of the resulting interconnect structure taken along cut lines 9-9 of FIG. 9 depicting the self-aligned vias to the metal lines according to embodiments of the invention.

FIGS. 9 and 10 depict a top down view and a cross-sectional view taken along the cut line 9-9, respectively, of the structure of FIG. 8 subsequent to selective removal of the hardmask using a wet or dry etching process followed by deposition of a dielectric layer 26, e.g., a low k dielectric, which can be the same or different as dielectric layer 16. As shown, the subtractive etching process as generally described above provides vias 27 that generally include a via core formed of metal 20 and a sidewall metal liner layer 24 having the original CD that are aligned with one of the pluralities of metal lines formed of metal 14. The resulting structure further retains the via sidewall liner material (i.e., metal 24) as indicated at "C" on top of some of the metal lines free of vias in contact therewith.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A back end of line interconnect structure comprising:
   a plurality of metal filled vias, each via comprising a via core of a first metal and a liner of a second metal;
   a plurality of metal lines formed of a third metal underlying the plurality of metal filled vias, wherein the metal filled vias are aligned with selected ones of the plurality of metal lines, and wherein other ones of the plurality of metal lines free from alignment of the metal filled vias in direct contact therewith comprise a portion of the liner on a top surface thereof; and
   a dielectric material, wherein the plurality of metal filled vias and the plurality of metal lines are defined in the dielectric material.

2. The back end of line interconnect structure of claim 1, wherein the plurality of metal filled vias have a top down shape comprising a circular shape, square shape or rectangular shape.

3. The back end of line interconnect structure of claim 1, wherein the first, second, and third metals are the same material.

4. The back end of line interconnect structure of claim 1, wherein at least one of the first, second, and third metals are different materials.

5. The back end of line interconnect structure of claim 1, wherein the dielectric material comprises a low k dielectric material having a k value less than 3.9.

6. The back end of line interconnect structure of claim 1, wherein a critical dimension of the plurality of metal filled vias is equal to a critical dimension of the metal lines.

7. The back end of line interconnect structure of claim 1, wherein the first, second and third metals comprise aluminum, copper, ruthenium, cobalt, rhodium, iridium, nickel, or alloys thereof or the like.

8. The back end of line interconnect structure of claim 1, wherein the metal filled vias are top vias.

9. A method for forming an interconnect structure comprising:
   depositing a dielectric layer onto a metal layer comprising a first metal;
   forming via openings in the dielectric layer;
   metallizing the via openings with a second metal to form a via metallization level;
   depositing and patterning a hard mask layer to form a metal line pattern therein;
   transferring the metal line pattern comprising lines and spaces into the via metallization level;
   isotropically etching to selectively remove at least a portion of the second metal from sidewalls of the dielectric layer, bottom surfaces, and form a via core of the second metal, wherein the via core has a diameter dimension less than a linewidth dimension of the metal line pattern;
   selectively depositing a liner of a third metal onto the via core to form metal vias having a critical dimension equal to the linewidth dimension of the metal line pattern in the hardmask layer;
   transferring the metal line pattern in the hardmask layer into the metal layer to form metal lines of the first metal, wherein the critical dimension of each of the metal vias is equal to a critical dimension of the metal lines; and
   removing the hardmask and depositing a dielectric material to form the interconnect structure.

10. The method of claim 9, wherein at least one of the via openings in the dielectric layer are at dimensions greater than an intended critical dimension of the metal filled vias.

11. The method of claim 9, wherein the dielectric material comprises a low k dielectric.

12. The method of claim 9, wherein isotropically etching comprises an atomic layer etching process.

13. The method of claim 9, wherein the first, second and third metals are the same metal.

14. The method of claim 9, wherein at least one of the first, second and third metal are different metals.

15. The method of claim 9, wherein the first, second and third metals comprise aluminum, copper, ruthenium, cobalt, rhodium, iridium, nickel, or alloys thereof or the like.

16. The method of claim 9, wherein selectively depositing the liner of the third metal onto the via core provides a residue of the second metal on a top of a metal line free of direct contact with the metal via.

17. A method of forming an interconnect structure comprising:
- depositing a bulk metal layer of a first metal onto a surface;
- depositing a dielectric layer on the bulk metal layer;
- forming metal filled vias in the dielectric layer with a second metal;
- depositing a hardmask layer on the metal filled vias in the dielectric layer and patterning the hardmask layer to form a metal line pattern;
- transferring the metal line pattern to the metal filled vias;
- trimming the metal filled vias to remove residual via metal to form a metal via core;
- selectively growing a third metal onto exposed surfaces of the first and second metals; and
- transferring the metal line pattern to the bulk metal layer, wherein the critical dimension of the metal vias defined by the metal via core and the third metal thereon are equal to a critical dimension of the metal lines.

18. The method of claim 17, wherein transferring the metal line pattern to the bulk metal layer provides the third metal on a top surface of a metal line free from direct contact with the metal via.

19. The method of claim 17, wherein selectively growing the third metal onto exposed surfaces of the first and second metals comprises an atomic layer deposition process.

20. The method of claim 17, wherein trimming the metal filled vias comprises an atomic layer etching process.

* * * * *